(12) United States Patent
Bogner et al.

(10) Patent No.: US 7,262,437 B2
(45) Date of Patent: Aug. 28, 2007

(54) RADIATION SOURCE AND METHOD FOR PRODUCING A LENS MOULD

(75) Inventors: Georg Bogner, Lappersdorf (DE);
Wolfgang Gramann, Regensburg (DE);
Patrick Kromotis, München (DE);
Werner Marchl, Barbing (DE);
Werner Späth, Holzkirchen (DE);
Günter Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/343,819

(22) PCT Filed: Jul. 30, 2001

(86) PCT No.: PCT/DE01/02874

§ 371 (c)(1),
(2), (4) Date: Jul. 15, 2003

(87) PCT Pub. No.: WO02/13231

PCT Pub. Date: Feb. 14, 2002

(65) Prior Publication Data

US 2004/0026706 A1    Feb. 12, 2004

(30) Foreign Application Priority Data

Aug. 4, 2000   (DE) ............................... 100 38 213

(51) Int. Cl.
*H01L 33/00* (2006.01)

(52) U.S. Cl. .................... 257/95; 257/98; 257/E33.068

(58) Field of Classification Search ................ 257/95, 257/88, 79, 89, 98, E33.068
See application file for complete search history.

(56) References Cited

U.S. PATENT DOCUMENTS

| 4,165,474 | A | 8/1979 | Myers |
| 4,975,814 | A | 12/1990 | Schairer |
| 5,528,474 | A | 6/1996 | Roney et al. |
| 5,600,148 | A | 2/1997 | Cole et al. |
| 5,726,719 | A | 3/1998 | Tanaka et al. |
| 6,096,159 | A | 8/2000 | Ito et al. |
| 6,365,920 | B1 * | 4/2002 | Abramov et al. ............. 257/81 |
| 6,665,060 | B1 * | 12/2003 | Zahniser et al. ............. 356/39 |
| 6,715,901 | B2 * | 4/2004 | Huang ........................ 362/294 |
| 2003/0178627 | A1 | 9/2003 | Marchl et al. |

FOREIGN PATENT DOCUMENTS

| DE | 196 21 148 | 12/1997 |
| EP | 0 354 468 | 2/1990 |
| GB | 1 203 357 | 8/1970 |
| JP | 61 079269 | 4/1986 |
| JP | 62 262023 | 11/1987 |
| JP | 63 032972 | 2/1988 |
| JP | 2-119256 | 8/1989 |
| JP | 3008204 | 1/1991 |
| JP | 4-323011 | 11/1992 |

(Continued)

*Primary Examiner*—Phat X. Cao
(74) *Attorney, Agent, or Firm*—Cohen Pontani Lieberman & Pavane LLP

(57) ABSTRACT

A radiation source has a field of semiconductor chips, which are disposed below a field of micro-lenses (8) disposed in a hexagonal lattice structure. The radiation source is distinguished by high radiation output and radiation density.

12 Claims, 5 Drawing Sheets

FOREIGN PATENT DOCUMENTS

| | | |
|---|---|---|
| JP | 5019705 | 1/1993 |
| JP | 08 227603 | 1/1997 |
| JP | 10 012926 | 1/1998 |
| JP | 10-012926 * | 1/1998 |
| WO | WO96/07523 | 3/1996 |
| WO | WO99 16136 | 4/1999 |

* cited by examiner

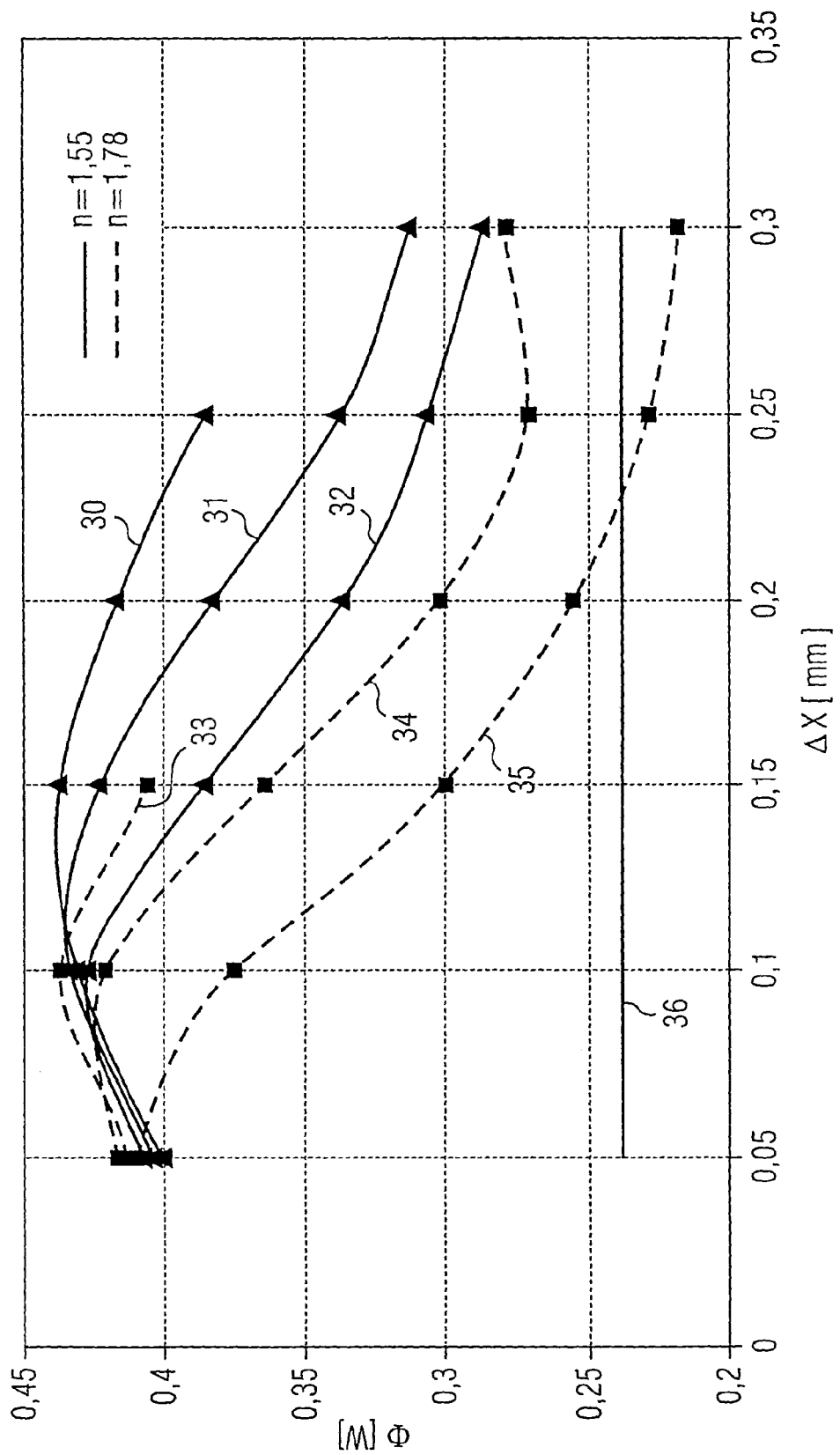

RADIATION SOURCE AND METHOD FOR PRODUCING A LENS MOULD

The invention relates to a radiation source with many radiation-emitting semiconductor chips disposed side by side.

The invention also relates to a method for producing a lens mold suitable for manufacturing a field of micro-lenses.

Radiation sources, such as light-emitting diodes, generally have a semiconductor chip cast integrally with a transparent lens body. It is also known for the radiation output of such radiation sources to be increased by the provision of many semiconductor chips. Such radiation sources typically have a condenser optical element, which comprises a lens. However, the radiation density of such radiation sources is often unsatisfactory if it is critically important to create a highly luminous radiation source with little three-dimensional spread.

With this prior art as the point of departure, it is the object of the invention to create a radiation source of high radiation density.

This object is attained according to the invention in that a field of lenses, forming a hexagonal lattice, is disposed upstream, in the projection direction, of the semiconductor chips.

Because of the hexagonal arrangement of the lenses, a high density of the associated semiconductor chips per unit of surface area can be attained. Since the lenses are typically formed by sphere segments, it is possible to use sphere segments with large radii for the lenses. As a result, the radiation-emitting active layer of the semiconductor chips can to a great extent be located inside the Weierstrass sphere (see Sze. Physics & Semiconductor Devices. 2 nd ed. Page 694 which is incorporated herein by reference) associated with the respective sphere. This leads to a high radiation yield for the individual semiconductor chips.

It is also the object of the invention to create a rational method for producing a lens mold suitable for manufacturing a field of lenses.

This object is attained according to the invention in that the lens mold is molded from a sheaf of closely-packed balls held by a hexagonal mounting.

Because of the hexagonal mounting, the sheaf of balls in a sense puts itself into a hexagonal lattice structure, when the balls rest tightly against one another. It therefore suffices to assure that the mounting is completely filled with the balls to be molded.

Further expedient features of the invention are the subject of the dependent claims.

Figure 1:
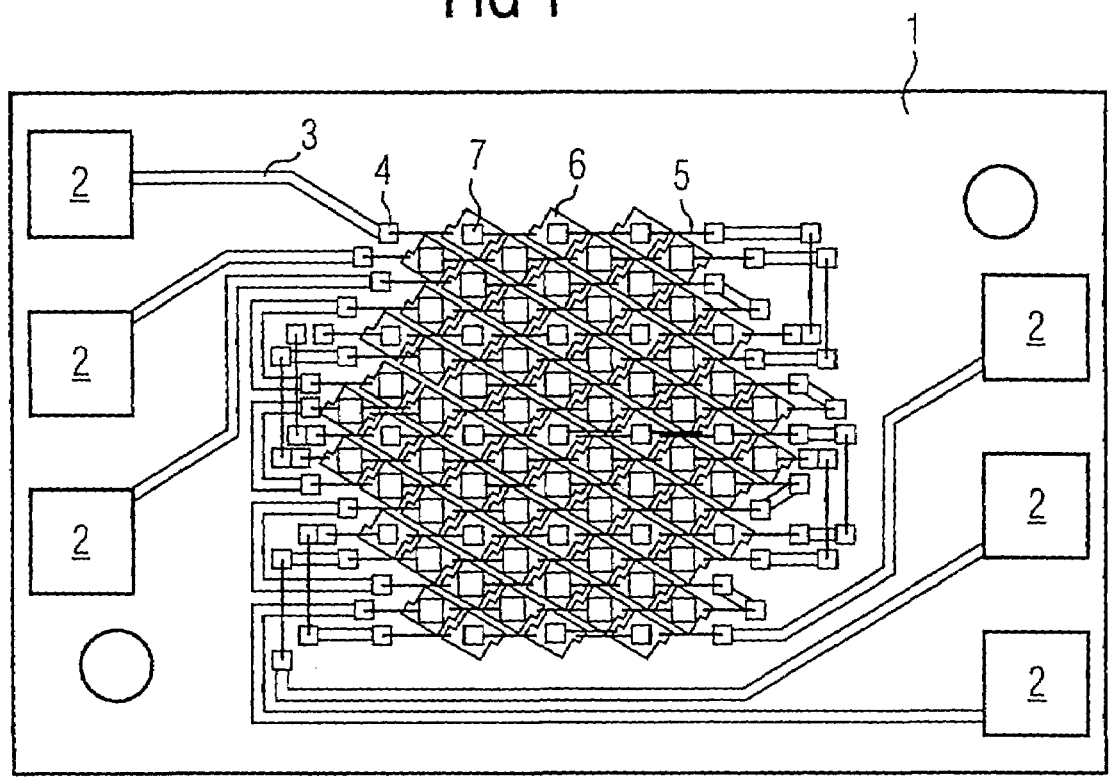
Figure 2:
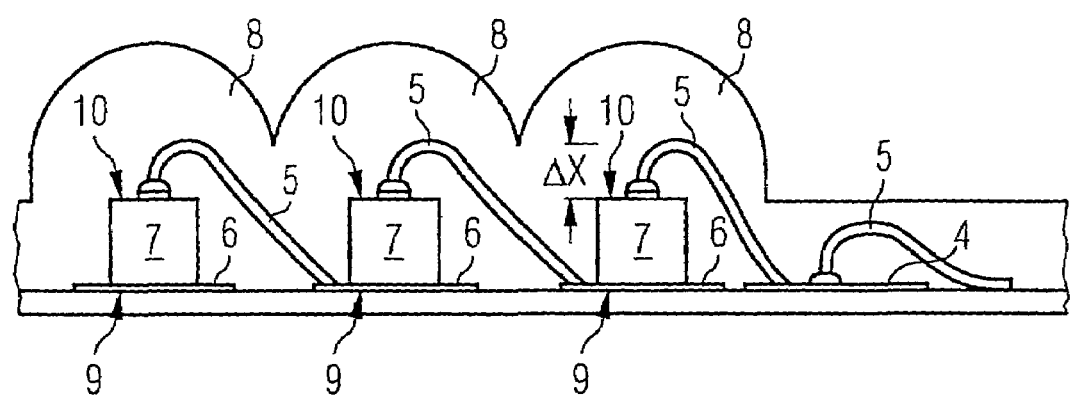
Figure 3:
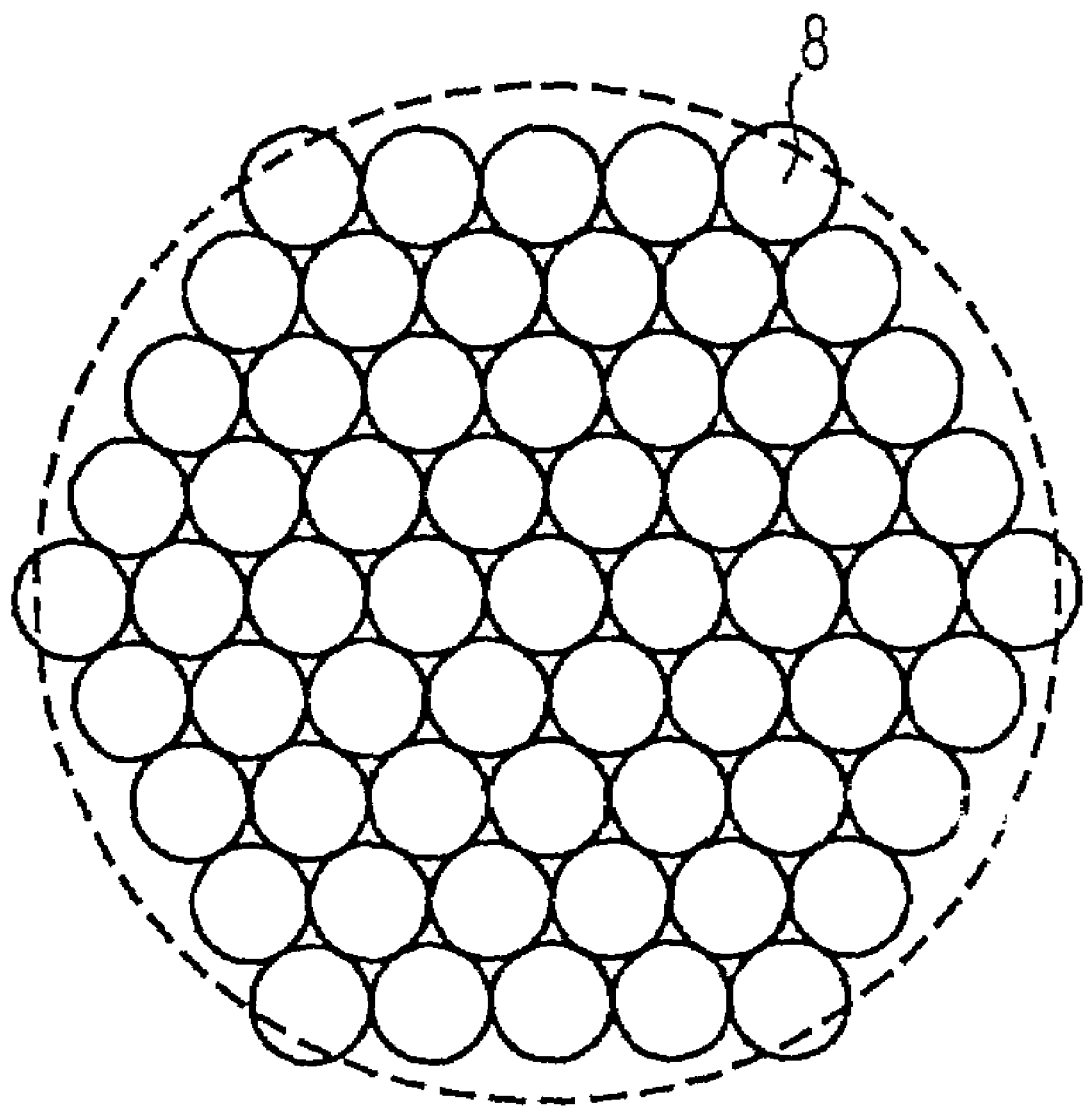
Figure 4:
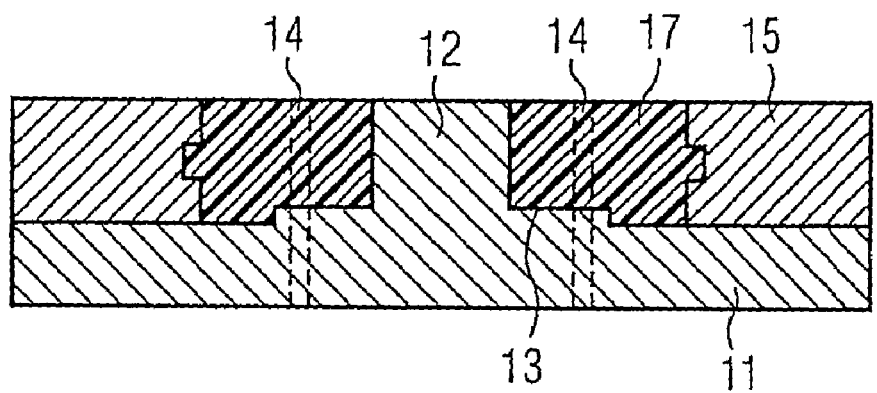
Figure 5:
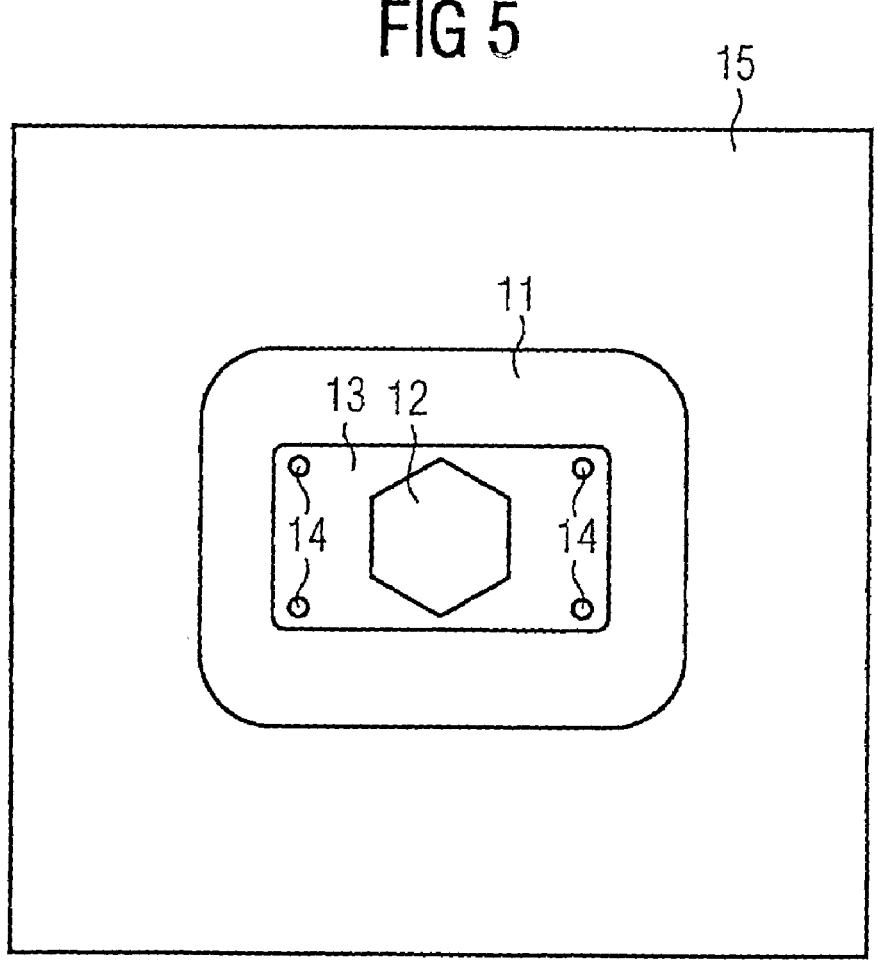
Figure 6:
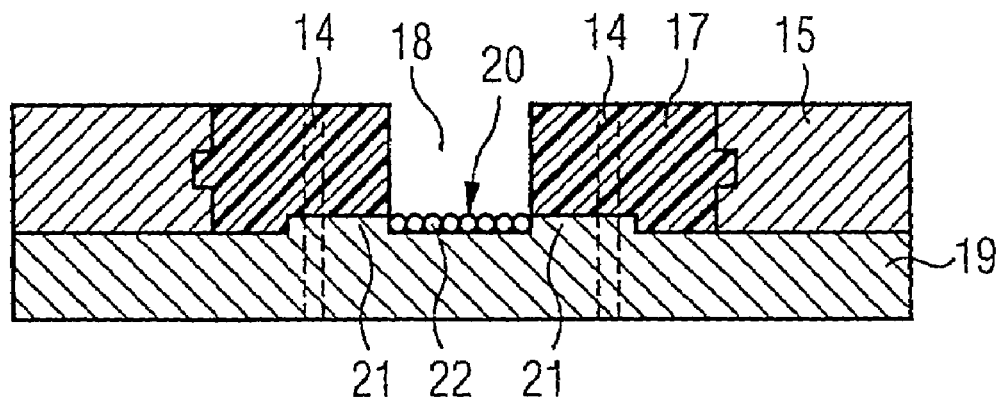
Figure 7:
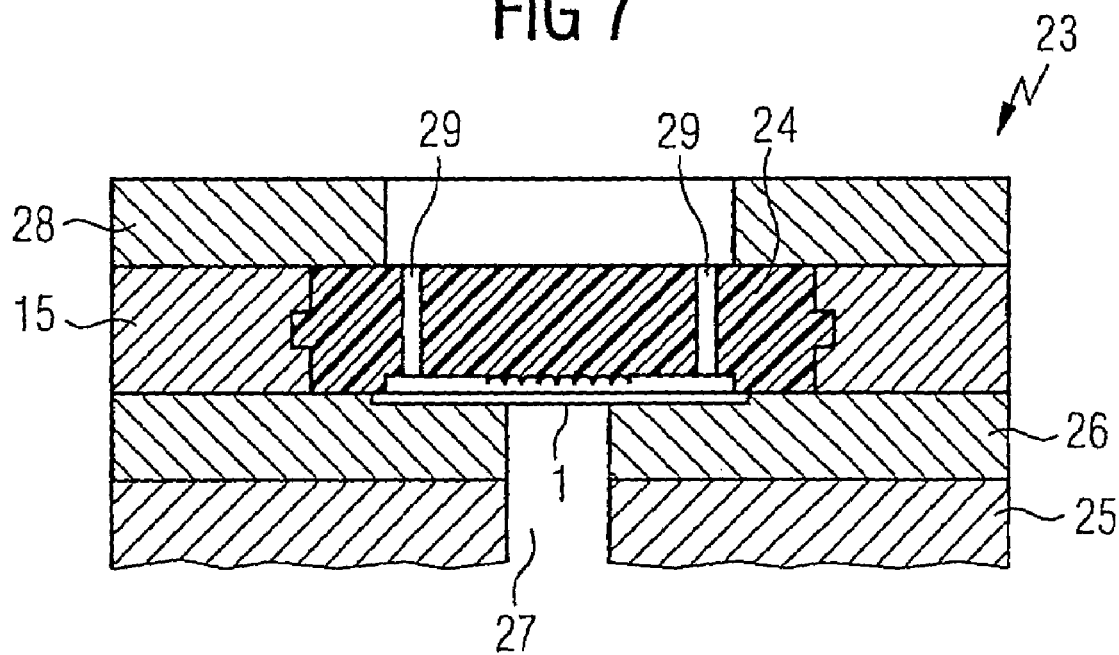

The invention will be described in below in detail in conjunction with the accompanying drawing. Shown are:

FIG. 1, a plan view on a printed circuit board, equipped with semiconductor chips and already bonded, for the radiation source of the invention;

FIG. 2, an enlarged cross-sectional view of the printed circuit board taken along line I—I of FIG. 1 above which micro-lenses have been placed;

FIG. 3, a plan view on a field of lenses;

FIG. 4, a cross section through an apparatus that can be used to produce a casting mold [that can be used to produce a] for fabricating a field of micro-lenses;

FIG. 5, a plan view of the apparatus of FIG. 4;

FIG. 6, a cross section through a further apparatus that can be used to produce the casting mold;

FIG. 7, a cross section through the casting apparatus used to produce the field of micro-lenses; and FIG. 8, a graph that shows the radiation output as a function of the spacing between the upper edge of the semiconductor chip and the associated hemispherical micro-lens.

FIG. 1 shows a plan view on a printed circuit board 1, which is made from $Al_2O_3$ or Si. Embodied on the printed circuit board 1 are terminal contacts 2, from which conductor tracks 3 lead to contact points 4, to which bond wires 5 are attached that lead to, among other things, chip contact faces 6. Semiconductor chips 7 are mounted on the chip contact faces 6 and are bonded in series line by line.

FIG. 2 shows an enlarged detail of a cross section through the printed circuit board 1 provided with micro-lenses 8. It can be seen that the semiconductor chips 7 are each mounted with an underside 9 on the chip contact faces 6. The bond wires 5 are each mounted on a top side 10 of the semiconductor chips 7 and lead to an adjacent chip contact face or to one of the contact points 4.

The micro-lenses 8 are half spheres with a radius R. The geometric center point of the micro-lenses 8 is located at a spacing $\Delta x$ from the top side of the semiconductor chips 7. The spacing $\Delta x$ is selected such that at least half of the radiation-emitting active layer of each of the semiconductor chips 7 is located inside the Weierstrass sphere of radius R/n, where n is the index of refraction of the material used for the micro-lens 8. The centers of the Weierstrass spheres coincide with the centers of the micro-lenses 8. Radiation generated inside the Weierstrass sphere can exit the micro-lens 8. It is therefore advantageous if as large as possible a portion of the active layers of the semiconductor chips 7 come to be located inside the Weierstrass sphere. It is therefore important to select as large as possible a radius of the micro-lenses 8. Conversely, in that case the spacing between semiconductor chips 7 must also be selected as correspondingly great. However, a great spacing between the semiconductor chips 7 means a low radiation density. The attempt is therefore made to keep the spacing between the micro-lenses 8 as slight as possible. The arrangement of micro-lenses 8 shown in FIG. 3 in a hexagonal lattice structure is the tightest possible arrangement of micro-lenses 8 and makes it possible to attain a high radiation output with at the same time a high radiation density.

The micro-lenses 8 are expediently cast from synthetic resin. The production method is performed as follows:

First, a first mold plate 11 is produced, which as shown in FIG. 4 has a central arbor 12 with a hexagonal cross section that can be seen in FIG. 5. The arbor 12 is disposed on a base 13. Alignment pins 14 are located in the vicinity of the base 13. A holder frame 15 is also mounted on the first mold plate 11 and has indentations 16 on its inside. The interior defined by the holder frame 15 is filled with silicone. A silicone frame 17 is thus formed, which in its center has an opening of hexagonal cross section. The silicone frame 17 engages the indentations 16 and can therefore be mounted easily, together with the holder frame 15, on a second mold plate 19, shown in FIG. 6. The alignment pins 14, also present here, serve to align the holder frame 15 and the silicone frame 17 on the second mold plate 19. As a result, the silicone frame 17 comes to rest on the second mold plate 19 in such a way that the opening 18 in the silicone frame 17 is aligned with a mounting 20 in the second mold plate 19. The mounting 20, with its sidebars 21, occupies the space in the silicone frame 17 that has been created by the base 13 of the first mold plate 11. Furthermore, it likewise has a hexagonal cross section. Tiny balls 22 are placed close together in the mounting 20. The tiny balls 22 have a radius that is essentially equivalent to the radius of the micro-lenses 8 to be produced. Since the mounting 20 has a hexagonal cross section, and since the tiny balls 22 are located close together, there balls 22 are arranged in accordance with a hexagonal lattice structure.

Next, the opening 18 is filled with silicone. The result is the micro-lens mold 24, shown in FIG. 7 in a casting apparatus 23. The casting apparatus 23 has a suction stub 25, on which a base plate 26 that holds the printed circuit board 1 is mounted. For that purpose, a central suction opening 27 is provided that leads to the printed circuit board 1. The holder frame 15 with the micro-lens mold 24 is located above the base plate 26. The two are partly covered by a pressing plate 28, which is connected to the base plate 26 via a screw connection, not shown, and assures the secure seat of the micro-lens mold 24 on the base plate 26.

The alignment pins 14 have left leadthroughs 29 behind in the micro-lens mold 24, and these leadthroughs serve to introduce the synthetic resin into the space in the micro-lens mold 24 above the printed circuit board 1.

It should be noted that the printed circuit board 1 under the micro-lens mold 24 is understood to have already been provided with the semiconductor chips 7 and been bonded in final form.

Finally, casting resin is introduced through the leadthroughs. This fills the space between the micro-lens mold 24 and the circuit board 1, thus molding the micro-lenses 8.

In FIG. 8, finally, a graph is shown in which the radiation output Φ is shown in a space angle, with a one-half opening angle of 60°, that is, an opening angle of 120°, as a function of the spacing Δx.

FIG. 8 shows the results of calculations. The calculations were performed with a semiconductor chip 7 with an outline of 200μm ×200μm and a height of 250μm. It was assumed that the semiconductor chip emitted 70% of its radiation output from the top side 10. The further 30% was assumed to emerge from the side faces of the semiconductor chip 7. As the spectrum, the spectrum of a black body at 2000 K was assumed. The calculations were performed for two types of casting resin in which the semiconductor chip 7 is embedded. These were first a casting resin with an index of refraction of n =1.55 and second a casting resin with an index of refraction of n =1.87. The calculated curves 30, 31 and 32 each represent the results from micro-lenses 8 with the radii of 250μm, 300μm, and 350μm, for an index of refraction of n =1.55. The curves 33, 34 and 35 each represent the results from micro-lenses 8 with the radii of 250μm, 300μm, and 350μm, for an index of refraction of n =1.78 of the casting resin. A line 36, finally, shows the results to be expected without a micro-lens 8.

The diameters of the micro-lenses 8 were 500μm, 600μm, and 700μm. FIG. 8 clearly shows that the radiation output in the space angle enclosed assumes its greatest values at a spacing Δx of 0.1 mm. The radiation output is then approximately twice as high as without micro-lenses 8. At this spacing, a large part of the active layer of the semiconductor chip 7 is also located inside the Weierstrass sphere of the micro-lenses 8.

The advantages of the hexagonal arrangement of micro-lenses 8 will become apparent from Table 1 that follows:

TABLE 1

| Arrangement | Square | Hexagonal | Hexagonal |
| --- | --- | --- | --- |
| Lens diameter | 600 μm | 600 μm | 700 μm |
| Area per unit cell | 0.36 mm$^2$ | 0.312 mm$^2$ | 0.42 mm$^2$ |
| Total radiation output at 70° half angle | 0.4777 W | 0.45919 W | 0.48668 W |
| Radiation conduction per unit of surface area | 1.3269 W/mm$^2$ | 1.4718 W/mm$^2$ | 1.1588 W/mm$^2$ |

From Table 1 it becomes clear that increasing the radius of the micro-lenses 8 does not necessarily lead to an increase in the radiation output per unit of surface area. This is because, although with the greater radius of the micro-lenses 8 a larger portion of the active layer of the semiconductor chips 7 comes to be located inside the Weierstrass sphere, in return the spacing of the semiconductor chips 7 increases, so that the luminance decreases.

For practical reasons, it may nevertheless be advantageous if a diameter of 700μm is selected for the micro-lenses 8, because otherwise problems can occur in bonding the semiconductor chips 7 to the chip contact faces 6 and in bonding the bond wires 5. Moreover, conventional casting resins shrink upon curing, which is why the cured micro-lenses are smaller by about 6% anyway than the corresponding molds of the micro-lens mold 24.

The invention claimed is:

1. A radiation source with many radiation-emitting semiconductor chips disposed side by side, wherein
    a field of integrally formed lenses, forming a hexagonal lattice, is disposed upstream, in the projection direction, of the semiconductor chips, and
    wherein color groups of the semiconductor chips are disposed in respective lines such that all the semiconductor chips in any given line are of an identical color group, with the color groups having their respective maximum emissions at different wavelengths.

2. The radiation source of claim 1, wherein the lenses are formed by half spheres.

3. The radiation source of claim 1, wherein the lenses are disposed in the hexagonally densest lattice.

4. The radiation source of claim 1, wherein the outline of the lattice has a hexagonal shape.

5. The radiation source of claim 1, wherein the semiconductor chips are bonded by line.

6. The radiation source of claim 1, wherein the field of lenses is integrally formed with a casting resin for the semiconductor chips.

7. A radiation source with many radiation-emitting semiconductor chips disposed side by side, wherein
    a field of integrally formed lenses, forming a hexagonal lattice, is disposed upstream, in the projection direction, of the semiconductor chips, and
    wherein color groups of the semiconductor chips are disposed in respective lines, with the color groups having their respective maximum emissions at different wavelengths, and the semiconductor chips of the radiation source are mounted directly on a shared circuit board.

8. The radiation source of claim 7, wherein the lenses are formed by half spheres.

9. The radiation source of claim 7, wherein the lenses are disposed in the hexagonally densest lattice.

10. The radiation source of claim 7, wherein the outline of the lattice has a hexagonal shape.

11. The radiation source of claim 7, wherein the semiconductor chips are bonded by line.

12. The radiation source of claim 7, wherein the field of lenses is integrally formed with a casting resin for the semiconductor chips.

\* \* \* \* \*